United States Patent
Haddadin et al.

(10) Patent No.: US 8,725,785 B1
(45) Date of Patent: May 13, 2014

(54) PARALLEL INFINITE IMPULSE RESPONSE FILTER

(75) Inventors: Osama S. Haddadin, Salt Lake City, UT (US); Brad T. Hansen, Salt Lake City, UT (US); Ryan Hinton, Crozet, VA (US)

(73) Assignee: L-3 Communications Corp., New York, NY (US)

( * ) Notice: Subject to any disclaimer, the term of this patent is extended or adjusted under 35 U.S.C. 154(b) by 1415 days.

(21) Appl. No.: 12/117,555

(22) Filed: May 8, 2008

Related U.S. Application Data (63) Continuation-in-part of application No. 10/914,554, filed on Aug. 9, 2004, now Pat. No. 7,747,666.

(51) Int. Cl.
*G06F 17/10* (2006.01)
(52) U.S. Cl.
USPC .......................................... 708/320; 708/313
(58) Field of Classification Search
USPC .......................... 708/313, 316, 320
See application file for complete search history.

(56) References Cited

U.S. PATENT DOCUMENTS

| | | | |
|---|---|---|---|
| 4,782,324 A * | 11/1988 | Underwood | 341/147 |
| 4,811,263 A | 3/1989 | Hedley et al. | |
| 4,821,223 A | 4/1989 | David | |
| 5,325,318 A | 6/1994 | Harris et al. | |
| 5,432,723 A | 7/1995 | Chen et al. | |
| 5,548,543 A * | 8/1996 | Wang | 708/319 |
| 5,926,455 A | 7/1999 | Allpress | |
| 6,889,238 B2 | 5/2005 | Johnson | |
| 2005/0286619 A1 | 12/2005 | Haddadin et al. | |
| 2006/0031274 A1 | 2/2006 | Haddadin et al. | |
| 2007/0156800 A1 | 7/2007 | Sturza et al. | |

OTHER PUBLICATIONS

Krukowski at al., "Polyphase IIR Filter Banks for Subband Adaptive Echo Cancellation Applications" IEEE, 2003, 4 pages.
U.S. Appl. No. 11/540,142, filed Sep. 28, 2006, Nelson.

* cited by examiner

*Primary Examiner* — Chuong D Ngo
(74) *Attorney, Agent, or Firm* — Kirton McConkie (57) ABSTRACT

A technique for performing parallel-input parallel-output infinite impulse response (IIR) filtering uses two parallel-input-parallel-output finite impulse response (FIR) filters. One FIR filter is used as a feed-forward filter and one FIR filter is used as a feed-back filter. The feed-back filter is coupled to delays and summers to allow the filter operations to be performed in parallel.

15 Claims, 8 Drawing Sheets

PARALLEL INFINITE IMPULSE RESPONSE FILTER

The present application is a continuation in part of commonly-owned co-pending U.S. patent application Ser. No. 10/914,554, filed Aug. 9, 2004, and entitled "Parallel Filter realization for Wideband Programmable Digital Radios" (hereinafter referred to as "Parent Case") which is hereby incorporated by reference.

FIELD OF THE INVENTION

The present application relates to digital filters. More particularly, the present application relates to infinite impulse response filters in a parallel-input parallel-output form.

BACKGROUND

Digital filtering is widely used in digital signal processing (DSP) applications. In DSP, a sequence of digital samples (e.g., numbers represented in binary format) represents an actual analog signal within a system (e.g., a communications system). The samples are taken at a generally fixed rate, referred to as the sample rate. Conversion between the digital samples and analog signals can be performed by analog to digital converters (ADCs) for signals entering the DSP subsystem, and by digital to analog converters (DACs) for signals exiting the DSP subsystem.

In a number of DSP applications, finite impulse filters (FIR) are quite popular. An FIR filter is a feed-forward filter form, in which an impulse input results in a finite time duration filter output sequence. FIR filters are popular, in part, as a number of efficient filter implementation forms are known. Many different design techniques for FIR filters are also available, making FIR filters generally easy to design and integrate into a DSP application. Polyphase FIR filters are also known which can be used to perform sample rate conversions, such as decimating (downsampling) and interpolating (upsampling).

In contrast to an FIR filter, an infinite impulse response filter (IIR) uses a feed-back filter form, in which an impulse input results in an infinite time duration filter output sequence. IIR filters have been less frequently used in DSP due to a number of factors. One factor is that the use of feedback complicates the use of pipelining techniques sometimes used to increase throughput in DSP systems. Design tools and techniques for digital IIR filters have also lagged somewhat behind those available for digital FIR filters. IIR filters can, however, provide advantages over FIR filters in some applications. For example, an IIR filter can provide superior filter characteristics (e.g., ripple, transition bandwith, etc.) to an FIR filter using similar amounts of DSP resources.

In many applications (e.g. software defined radio technology used in communications systems) high digital filter processing rates are desired. Very high sample rates can present a number of challenges to the design of digital filters. For example, even when a low output rate of a filter is desired (e.g., because a high decimation factor is present), many input samples must be stored and processed by the filter. Conversely, an interpolating filter may have a low input sample rate, but be required to produce a high output sample rate. Thus, portions of a digital filter typically operate at either the input sample rate or the output sample rate.

Unfortunately, ADC and DAC speeds can outpace the processing rates achievable in some DSP chips (DSPCs) and field programmable gate arrays (FPGAs). While the processing speed of programmable gate arrays, custom hardware, and processors continues to improve each year, sample rate requirements and available ADC and DAC speeds have also been increasing. Thus, there is often a mismatch between the input or output samples rates desired, and the processing rates which can be achieved using straightforward DSP techniques.

SUMMARY OF THE INVENTION

It has been recognized that it would be advantageous to develop a parallel-input parallel-output infinite impulse response filter.

In some embodiments of the invention an infinite impulse response (IIR) filter has a parallel-input and a parallel-output. The IIR filter can include a first finite impulse response filter having a parallel input and a parallel output, a plurality of delays coupled to the first finite impulse response filter, and a plurality of summers coupled in a feed-back arrangement to the plurality of delays and to the first finite impulse response filter so as to form an all-pole filter. The IIR filter can also include a second finite impulse response filter having a parallel input and a parallel output to form an all-zero filter. The first finite impulse response filter and the second finite impulse response filter can be coupled to form an infinite impulse response filter having both poles and zeros.

In some embodiments of the invention a method for performing a parallel-input parallel-output infinite impulse response filter can include accepting a plurality of N input samples in a parallel form and performing, in parallel, a plurality of finite impulse response filtering operations to form a plurality of M first intermediate samples in parallel form. The first intermediate samples can be an all-zero filtered version of the input samples. Another operation can be summing the plurality of first intermediate samples with a plurality of M second intermediate samples, in parallel, to form a plurality of M output samples in parallel form. The second intermediate samples can be obtained by performing, in parallel, a plurality of finite impulse response filtering operations on the plurality of output samples, with appropriate delays, so that the plurality of output samples are an all-pole filtered version of the first intermediate samples.

In some embodiments of the invention a method for performing a parallel-input parallel-output infinite impulse response filter can include accepting a plurality of N input samples in a parallel form and summing the plurality of N input samples with a plurality of N first intermediate samples to form a plurality of N second intermediate samples in parallel form. Another operation can be performing in parallel a plurality of finite impulse response filtering operations on the plurality of N second intermediate samples to form the plurality of N first intermediate samples, in parallel form, and with appropriate delays so that the N second intermediate samples are an all-pole filtered version of the input samples. The method can also include performing in parallel a plurality of finite impulse response filtering operations on the plurality of second intermediate samples to provide a plurality of M output samples, in parallel form, that are an all-zero filtered version of the second intermediate samples.

BRIEF DESCRIPTION OF THE DRAWINGS

Additional features and advantages of the invention will be apparent from the detailed description which follows, taken in conjunction with the accompanying drawings, which together illustrate, by way of example, features of the invention; and, wherein.

DETAILED DESCRIPTION

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

The challenges addressed by high sample rates in an FIR filter have been addressed to some extent using parallel processing techniques. For example, the above-mentioned Parent Case describes various implementations of a block parallel FIR filter. The block parallel filter can provide for higher processing throughput in part because samples are input in a parallel form and output samples are also provided in a parallel form.

Parallel input refers to providing more than one sample simultaneously at the input to the filter, in contrast to conventional DSP techniques were one sample at a time is provided as input. Similarly, parallel output refers to providing more than one sample simultaneously at the output of the filter. It should be noted that thus use of parallel-input here is distinct from so-called parallel data, where, for example a single 8-bit sample is provided as 8-binary values on 8 separate lines which are all valid on the same clock edge. In contrast, parallel-input here means that N samples (N≥2) or data words are provided simultaneously. For example, if N=2, and each sample has 8 bits of resolution, a total of 16 data lines can be used (8 for each sample). Of course, various values for N can be used, such as N=2, 3, 4, 8, etc.

By using parallel input and parallel output, input and output from the filter can occur at clock rates lower than the overall sample rate. For example, using a parallelism of N=4, the filter clock rate can be one fourth of the sample rate. This can allow for processing of a relatively high sample rate using circuitry which operates at a lower clock rate. For example, multiplications and other operations in the filter can be performed in parallel using a number of processing components (e.g. multipliers, adders, etc).

In contrast to an FIR filter, however, providing a parallel-input parallel-output form IIR filter is less straightforward because of the feed-back terms. To maintain proper timing relationships of various terms within the filter, various delay elements can be used within the feed-back path.

Figure 1:
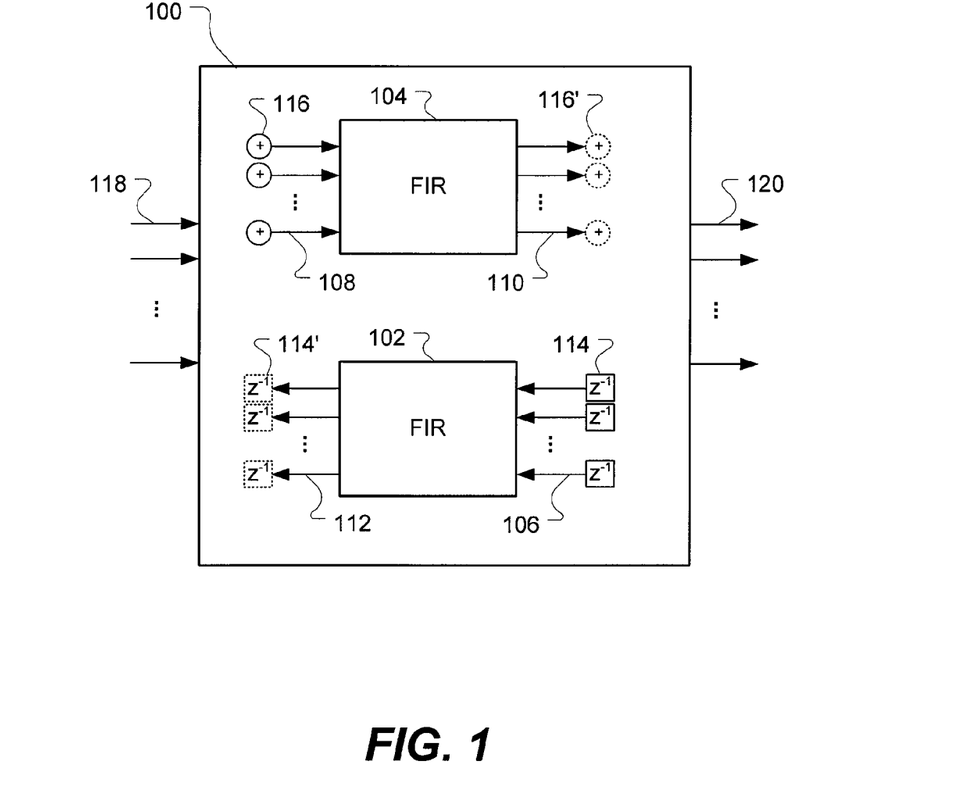
FIG. 1 is a block diagram of a parallel-input parallel-output infinite impulse response filter in accordance with some embodiments of the present invention.

FIG. 1 provides a high level block diagram of a parallel-input parallel-output IIR filter in accordance with some embodiments of the present invention. The IIR filter 100 accepts parallel-input samples 118 and produces parallel-output samples 120. The IIR filter includes a first FIR filter 102 and a second FIR filter 104. Both the first FIR filter and the second FIR filter accept parallel-input samples 106, 108 and produce parallel-output samples 110, 112. The second FIR filter is arranged in a feed forward arrangement to form an all-zero filter. A plurality of delays 114 or 114' (the delays can be positioned at either of the input or the output of the first FIR filter) and a plurality of summers 116 or 116' are coupled to the first FIR filter in a feed-back arrangement to form an all-pole filter. Various different ways of interconnecting the summers 116 or 116' can be used, as described in further detail below. The first FIR filter and the second FIR filter are coupled (e.g., cascaded) to form a filter having both poles and zeros. Various arrangements for the coupling can be used as is described in further detail below.

Operation of the parallel-input parallel-output IIR filter can be described mathematically. In general, an IIR filter can be described by the difference equation:

$$y(n) = \sum_{k=0}^{K-1} b(k)x(n-k) - \sum_{k=1}^{L} a(k)y(n-k) \quad (1)$$

where x(n) are the input samples (n being the sample number or time index) and y(n) are the output samples. K represents the number of taps in the feed-forward filter, which has coefficients {b(k)} and L represents the number of taps in the feed-back filter, which has coefficients {a(k)}.

The system function, i.e., the z transform of the impulse response h(n), can be defined as $$H(z) = \frac{Y(z)}{X(z)} = \frac{\sum_{k=0}^{K-1} b(k)z^{-k}}{1 + \sum_{k=1}^{L} a(k)z^{-k}} = \frac{B(z)}{1 + A(z)}. \quad (2)$$

The filter can thus be described by the system function H(z), by the all-zero (feed-forward) and all-pole (feed-back) components, B(z) and A(z), respectively, or by the time-domain feed-forward and feed-back taps, b(k) and a(k), respectively. All of the descriptions are equivalent mathematically.

Figure 2:
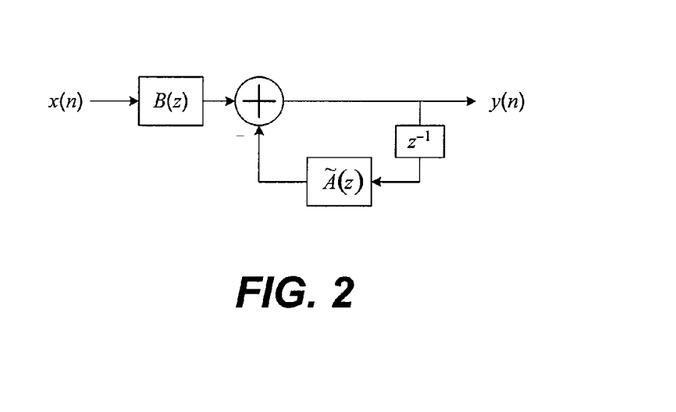
FIG. 2 is a block diagram of an infinite impulse response filter.

There are several different arrangements in which the filter can be implemented. For example, we can re-write Equation (2) as:

$$Y(z) = B(z)X(z) - A(z)Y(z) \quad (3)$$

$$= B(z)X(z) - z^{-1}Y(z)\sum_{k=1}^{N} a(k)z^{-k}$$

$$= B(z)X(z) - z^{-1}Y(z)\sum_{k=0}^{N-1} a(k+1)z^{-k}$$

which is equivalent to the following time-domain convolution equation:

$$y(n) = x(n) * b(n) - y(n-1) * \tilde{a}(n), \quad (4)$$

with impulse response $\tilde{a}(n) = \{a(1), a(2), \ldots, a(L)\}$. This is shown in block diagram form in FIG. 2.

A parallel-input, parallel-output implementation of the filter of FIG. 2 can thus be produced from Equation (4) as will now be described.

Figure 3:
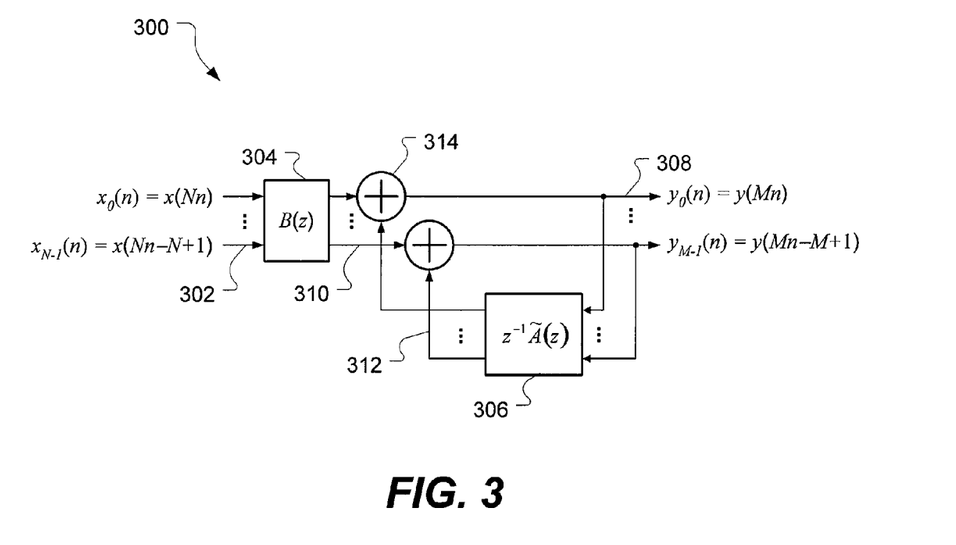
FIG. 3 is a block diagram of one detailed implementation of a parallel-input parallel-output infinite impulse response filter in accordance with some embodiments of the present invention.

FIG. 3 illustrates a parallel-input parallel-output IIR filter according to some embodiments of the present invention. The filter 300 can be referred to as a zero-pole filter, since parallel-input samples 302 are first feed-forward filtered by an all-zero filter 304, and then filtered by an all-pole filter 306 to produce parallel-output samples 308. The delays in the feed-back section have been absorbed into the all-pole filter for simplicity in representation, as will become more clear from the below discussion.

Because the inputs 302 are provided in parallel form, the feed-forward filter 304 can be decomposed as a polyphase filter. In general, the feed-forward filter may have N inputs 302 in parallel and M outputs 310 in parallel. For the case where N=M, the filter can be expressed as:

$$\begin{bmatrix} U_0(z) \\ U_1(z) \\ \vdots \\ U_{M-2}(z) \\ U_{M-1}(z) \end{bmatrix} = \quad (5)$$

$$\begin{bmatrix} G_0(z) & G_1(z) & \ldots & G_{M-2}(z) & G_{M-1}(z) \\ z^{-1}G_{M-1}(z) & G_0(z) & \ldots & G_{M-3}(z) & G_{M-2}(z) \\ \vdots & \vdots & \ddots & \vdots & \vdots \\ z^{-1}G_2(z) & z^{-1}G_3(z) & \ldots & G_0(z) & G_1(z) \\ z^{-1}G_1(z) & z^{-1}G_2(z) & \ldots & z^{-1}G_{M-1}(z) & G_0(z) \end{bmatrix} \begin{bmatrix} X_0(z) \\ X_1(z) \\ \vdots \\ X_{M-2}(z) \\ X_{M-1}(z) \end{bmatrix}$$

where $U_i(z)$ is i-th phase output of the feed-forward filter, which is the z-domain of $u_i(n)=u(Mn-i)$, and $G_i(z)$, the z-domain representation of $g_i(n)$, are the polyphase components of the feed-forward filter B(z). The polyphase components can be obtained from the filter response as will now be described.

In a polyphase filter, the polyphase filter can expanded as the sum of a number of sub-filters which can be referred to as polyphase components. This expansion can be particularly useful in decimation and interpolation operations as discussed further below in this text. First, for the case of an FIR filter, the response can be represented as follows:

$$H(z) = \sum_{n=0}^{\infty} h(n)z^{-n} \quad (6)$$

$$= \sum_{n=0}^{\infty} [h(Mn)z^{-Mn} + h(Mn+1)z^{-(Mn+1)} + \ldots + h(Mn+M-1)z^{-(Mn+M-1)}]$$

$$= \sum_{n=0}^{\infty} h(Mn)z^{-Mn} + \sum_{n=0}^{\infty} h(Mn+1)z^{-(Mn+1)} + \ldots + \sum_{n=0}^{\infty} h(Mn+M-1)z^{-(Mn+M-1)}$$

$$= z^{-0}\sum_{n=0}^{\infty} h(Mn)z^{-Mn} + z^{-1}\sum_{n=0}^{\infty} h(Mn+1)z^{-Mn} + \ldots + z^{-M+1}\sum_{n=0}^{\infty} h(Mn+M-1)z^{-Mn}$$

$$= z^{-0}H_0(z^M) + z^{-1}H_1(z^M) + \ldots + z^{-M+1}H_{M-1}(z^M),$$

or $$H(z) = \sum_{i=0}^{M-1} z^{-i}H_i(z^M), \quad (7)$$

where $H_i(z)$ are the polyphase components of the filter H(z).

If desired, the input-output relationship can be obtained in the z-domain:

$$Y(z) = H(z)X(z) \quad (8)$$

$$= \sum_{i=0}^{M-1} z^{-1} H_i(z^M) X^{(z)}$$

or $$Y(z) = \sum_{i=0}^{M-1} H_i(z^M)[z^{-i}X(z)], \quad (9)$$

in which the delays are combined with the input signal. From an implementation standpoint, delays can be provided by various means, including for example shift registers, memory distributed within an FPGA, memory chips, and the like. As noted above, delays can be provided at the input, or at the output of the filter.

The order (or number of taps) of each of the polyphase sub-filters is K/M where K is the number of taps in the original filter h(n) and M is the expansion factor.

The filter components, $H_i(z^M)$, introduced in Equation (4) and are defined via the z-transform as follows:

$$H_0(z^M) \Leftrightarrow \{h(0) \quad 0 \ldots 0 \quad h(M) \quad 0 \ldots 0 \quad h(2M) \quad 0 \ldots\} \quad (10)$$

$$H_1(z^M) \Leftrightarrow \{h(1) \quad 0 \ldots 0 \quad h(M+1) \quad 0 \ldots 0 \quad h(2M+1) \quad 0 \ldots\}$$

$$\vdots \quad \vdots \quad \vdots$$

$$H_{M-1}(z^M) \Leftrightarrow \{h(M-1) \quad 0 \ldots 0 \quad h(2M-1) \quad 0 \ldots 0 \quad h(3M-1) \quad 0 \ldots\}$$

where h(n) are the FIR filter coefficients. $H_i(z)$ for $i = 0, 1, \ldots, M-1$ are the polyphase components and are related to the time domain filter coefficients h(n), n=0, 1, ..., M−1 by $h_i(n) = h(Mn+i)$ or, explicitly stated, by $$H_0(z) \Leftrightarrow h_0 = \{h(0) \quad h(M) \quad h(2M) \ldots\} \quad (11)$$

$$H_1(z) \Leftrightarrow h_1 = \{h(1) \quad h(M+1) \quad h(2M+1) \ldots\}$$

$$\vdots \quad \vdots \quad \vdots$$

$$H_{M-1}(z) \Leftrightarrow h_{M-1} = \{h(M-1) \quad h(2M-1) \quad h(3M-1) \ldots\}.$$

For the case where upsampling is performed, the filter components are an interpolated version (by interpolation factor of M) of the polyphase filter components (see Equations (13) and (14) below). For example, the non-zero coefficients in Equation (13) are separated by M−1 zeros, which is identified in the z-domain by the $z^M$ instead of z.

Figure 4:
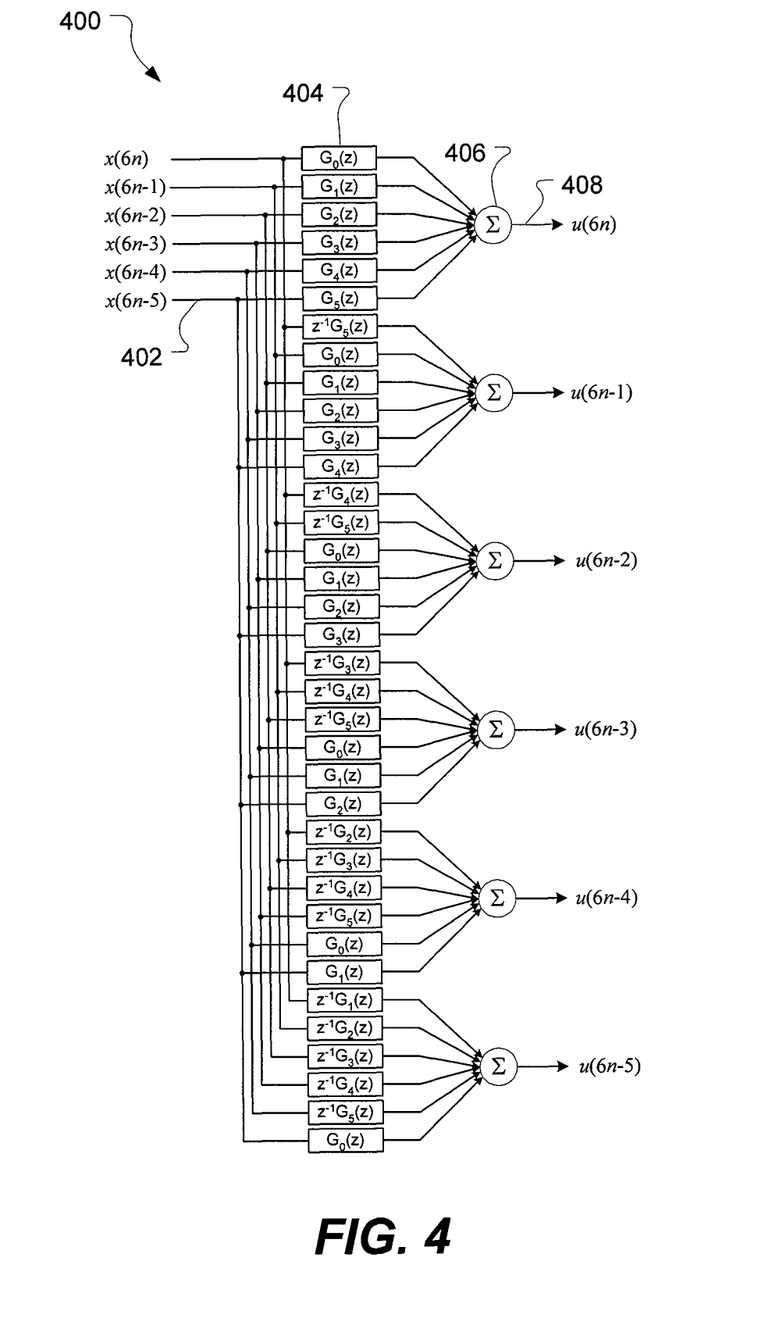
FIG. 4 is a block diagram of a downsampling finite impulse response filter that can be used as a feed-forward part of a parallel-input parallel-output infinite impulse response filter in accordance with some embodiments of the present invention.

Some specific examples will now be provided. One implementation of a parallel FIR filter for the case where M=N=6 is depicted in FIG. 4 and is defined by the following input-output relationship:

$$\begin{bmatrix} U_0(z) \\ U_1(z) \\ U_2(z) \\ U_3(z) \\ U_4(z) \\ U_5(z) \end{bmatrix} = \quad (12)$$

$$\begin{bmatrix} G_0(z) & G_1(z) & G_2(z) & G_3(z) & G_4(z) & G_5(z) \\ z^{-1}G_5(z) & G_0(z) & G_1(z) & G_2(z) & G_3(z) & G_4(z) \\ z^{-1}G_4(z) & z^{-1}G_5(z) & G_0(z) & G_1(z) & G_2(z) & G_3(z) \\ z^{-1}G_3(z) & z^{-1}G_4(z) & z^{-1}G_5(z) & G_0(z) & G_1(z) & G_2(z) \\ z^{-1}G_2(z) & z^{-1}G_3(z) & z^{-1}G_4(z) & z^{-1}G_5(z) & G_0(z) & G_1(z) \\ z^{-1}G_1(z) & z^{-1}G_2(z) & z^{-1}G_3(z) & z^{-1}G_4(z) & z^{-1}G_5(z) & G_0(z) \end{bmatrix} \begin{bmatrix} X_0(z) \\ X_1(z) \\ X_2(z) \\ X_3(z) \\ X_4(z) \\ X_5(z) \end{bmatrix}.$$

The filter 400 accepts parallel-input samples x(6n) ... x(6n−5) 402 which are processed in parallel by a plurality of filter segments 404 or phases. The outputs of the filter segments are summed by a plurality of summers 406 to produce parallel-output samples u(6n) ... u(6n−5) 408. A set of parallel filtering operations is performed at one-sixth the sample clock rate. Thus, the effect of the $z^{-1}$ delays is to produce a delay of six sample clocks.

If desired, a change in the sample rate can be produced by increasing or decreasing the number of filter segments (phases). For example, for a decrease in sample rate, N>M, M can be set equal to an integer N/D where D is the decimation factor. For example, D can be set to be an integer 2, 3, 4, etc. For an increase in sample rate, N<M, M can be set equal to an integer N*U where U is the upsampling or interpolation factor. For example, U can be set to be an integer 2, 3, 4, etc.

Figure 5:
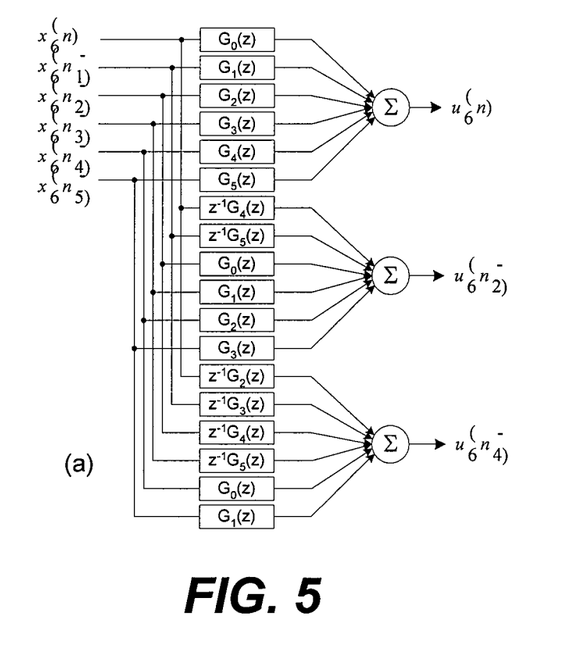
FIG. 5 is a block diagram of another downsampling finite impulse response filter that can be used as a feed-forward part of a parallel-input parallel-output infinite impulse response filter in accordance with some embodiments of the present invention.
Figure 6:
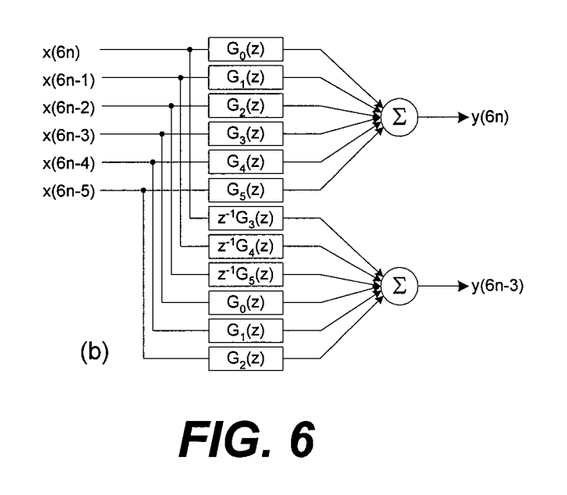
FIG. 6 is a block diagram of yet another downsampling finite impulse response filter that can be used as a feed-forward part of a parallel-input parallel-output infinite impulse response filter in accordance with some embodiments of the present invention.

FIG. 5 illustrates an exemplary FIR filter performing decimation by a factor of D=2 (N=6, M=3) and FIG. 6 illustrates an exemplary FIR filter performing decimation by a factor D=3 (N=6, M=2). The filtering of FIG. 5 can be described in matrix notation:

$$\begin{bmatrix} U_0(z) \\ U_2(z) \\ U_4(z) \end{bmatrix} = \quad (13)$$

-continued $$\begin{bmatrix} G_0(z) & G_1(z) & G_2(z) & G_3(z) & G_4(z) & G_5(z) \\ z^{-1}G_4(z) & z^{-1}G_5(z) & G_0(z) & G_1(z) & G_2(z) & G_3(z) \\ z^{-1}G_2(z) & z^{-1}G_3(z) & z^{-1}G_4(z) & z^{-1}G_5(z) & G_0(z) & G_1(z) \end{bmatrix} \begin{bmatrix} X_0(z) \\ X_1(z) \\ X_2(z) \\ X_3(z) \\ X_4(z) \\ X_5(z) \end{bmatrix}$$

and the filtering of FIG. 6 can be described in matrix notation:

$$\begin{bmatrix} U_0(z) \\ U_3(z) \end{bmatrix} = \quad (14)$$

$$\begin{bmatrix} G_0(z) & G_1(z) & G_2(z) & G_3(z) & G_4(z) & G_5(z) \\ z^{-1}G_3(z) & z^{-1}G_4(z) & z^{-1}G_5(z) & G_0(z) & G_1(z) & G_2(z) \end{bmatrix} \begin{bmatrix} X_0(z) \\ X_1(z) \\ X_2(z) \\ X_3(z) \\ X_4(z) \\ X_5(z) \end{bmatrix}$$

Figure 7:
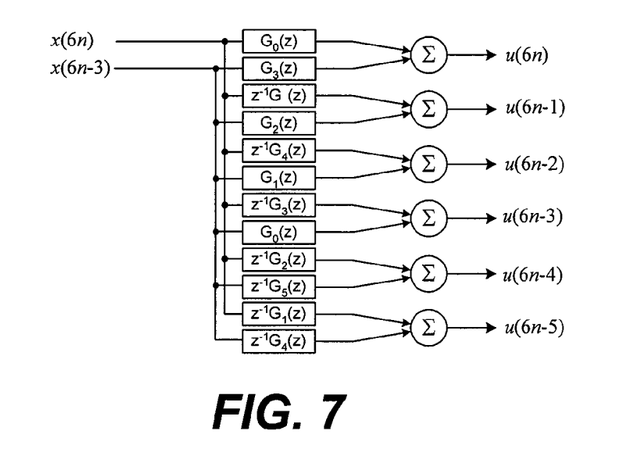
FIG. 7 is a block diagram of an upsampling finite impulse response filter that can be used as a feed-back part of a parallel-input parallel-output infinite impulse response filter in accordance with some embodiments of the present invention.

FIG. 7 illustrates an exemplary FIR filtering performing interpolation by a factor U=3 (N=2, M=6), which can be described in matrix form:

$$\begin{bmatrix} Y_0(z) \\ Y_1(z) \\ Y_2(z) \\ Y_3(z) \\ Y_4(z) \\ Y_5(z) \end{bmatrix} = \begin{bmatrix} G_0(z) & G_3(z) \\ z^{-1}G_5(z) & G_2(z) \\ z^{-1}G_4(z) & G_1(z) \\ z^{-1}G_3(z) & G_0(z) \\ z^{-1}G_2(z) & z^{-1}G_5(z) \\ z^{-1}G_1(z) & z^{-1}G_4(z) \end{bmatrix} \begin{bmatrix} X_0(z) \\ X_1(z) \end{bmatrix} \quad (15)$$

In general, the feed-forward filter may use any of these forms or similar arrangements. Accordingly, the feed-forward filter can have N parallel inputs and M parallel outputs, where N=M, N<M, N>M.

Returning to FIG. 3, we now discuss the feed-back filter 306. The feed-back filter can also be implemented using a parallel-input parallel-output filter, using similar techniques as the feed-forward filter. Accordingly, the feed-back filter can be described by the following input-output z-domain relation:

$$\begin{bmatrix} V_0(z) \\ V_1(z) \\ \vdots \\ V_{M-2}(z) \\ V_{M-1}(z) \end{bmatrix} = \quad (16)$$

$$\begin{bmatrix} z^{-1}\tilde{A}_{M-1}(z) & \tilde{A}_0(z) & \ldots & \tilde{A}_{M-3}(z) & \tilde{A}_{M-2}(z) \\ z^{-1}\tilde{A}_{M-2}(z) & z^{-1}\tilde{A}_{M-1}(z) & \tilde{A}_0(z) & \ldots & \tilde{A}_{M-3}(z) \\ \vdots & \vdots & \ddots & \vdots & \vdots \\ z^{-1}\tilde{A}_1(z) & z^{-1}\tilde{A}_2(z) & \ldots & z^{-1}\tilde{A}_{M-1}(z) & \tilde{A}_0(z) \\ z^{-1}\tilde{A}_0(z) & z^{-1}\tilde{A}_1(z) & \ldots & z^{-1}\tilde{A}_{M-2}(z) & z^{-1}\tilde{A}_{M-1}(z) \end{bmatrix} \begin{bmatrix} Y_0(z) \\ Y_1(z) \\ \vdots \\ Y_{M-2}(z) \\ Y_{M-1}(z) \end{bmatrix}$$

where $V_i(z)$, the z-transform of $v_i(n)$, is the i-th phase at the output 312 of the feed-back filter.

Figure 8:
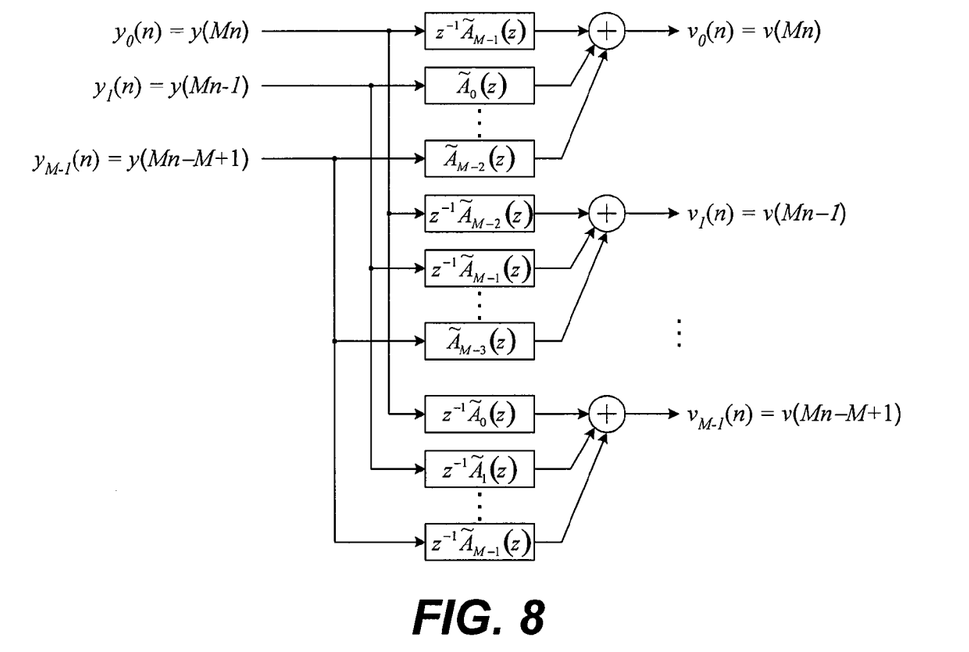
FIG. 8 is a block diagram of a finite impulse response filter that can be used as a feed-back part of a parallel-input parallel-output infinite impulse response filter in accordance with some embodiments of the present invention.

FIG. 8 provides a block diagram of one embodiment of a feed-back filter. Note that the feed-back filter for this example, is an M-input, M-output parallel filter, and no decimation or interpolation is performed.

Figure 9:
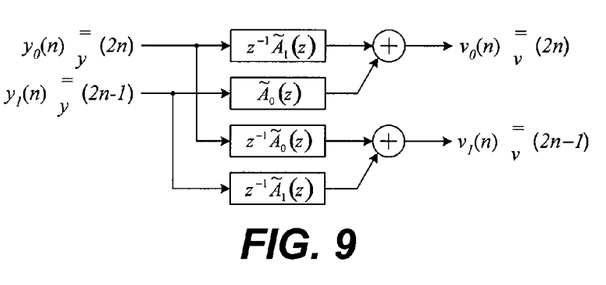
FIG. 9 is a block diagram of another finite impulse response filter that can be used as a feed-back part of a parallel-input parallel-output infinite impulse response filter in accordance with some embodiments of the present invention.

A specific example of a parallel implementation of a feed-back filter for M=2 is shown in FIG. 9 and is described by the equation:

$$\begin{bmatrix} V_0(z) \\ V_1(z) \end{bmatrix} = \begin{bmatrix} z^{-1}\tilde{A}_1(z) & \tilde{A}_0(z) \\ z^{-1}\tilde{A}_0(z) & z^{-1}\tilde{A}_1(z) \end{bmatrix} \begin{bmatrix} Y_0(z) \\ Y_1(z) \end{bmatrix} \quad (17)$$

Equations (16) and (17) can be re-written as:

$$\begin{bmatrix} V_0(z) \\ V_1(z) \\ \vdots \\ V_{M-2}(z) \\ V_{M-1}(z) \end{bmatrix} = \begin{bmatrix} \tilde{A}_0(z) & \tilde{A}_1(z) & \ldots & \tilde{A}_{M-2}(z) & \tilde{A}_{M-1}(z) \\ z^{-1}\tilde{A}_{M-1}(z) & \tilde{A}_0(z) & \ldots & \tilde{A}_{M-3}(z) & \tilde{A}_{M-2}(z) \\ \vdots & \vdots & \ddots & \vdots & \vdots \\ z^{-1}\tilde{A}_2(z) & z^{-1}\tilde{A}_3(z) & \ldots & \tilde{A}_0(z) & \tilde{A}_1(z) \\ z^{-1}\tilde{A}_1(z) & z^{-1}\tilde{A}_2(z) & \ldots & z^{-1}\tilde{A}_{M-1}(z) & \tilde{A}_0(z) \end{bmatrix} \quad (18)$$

$$\begin{bmatrix} 0 & 1 & 0 & \ldots & 0 \\ 0 & 0 & 1 & \ldots & 0 \\ \vdots & \vdots & \vdots & \ddots & \vdots \\ 0 & 0 & 0 & \ldots & 1 \\ z^{-1} & 0 & 0 & 0 & 0 \end{bmatrix} \begin{bmatrix} Y_0(z) \\ Y_1(z) \\ \vdots \\ Y_{M-2}(z) \\ Y_{M-1}(z) \end{bmatrix}$$

and $$\begin{bmatrix} V_0(z) \\ V_1(z) \end{bmatrix} = \begin{bmatrix} \tilde{A}_0(z) & \tilde{A}_1(z) \\ z^{-1}\tilde{A}_1(z) & \tilde{A}_0(z) \end{bmatrix} \begin{bmatrix} 0 & 1 \\ z^{-1} & 0 \end{bmatrix} \begin{bmatrix} Y_0(z) \\ Y_1(z) \end{bmatrix}. \quad (19)$$

This demonstrates that the feed-back filter can be decomposed into two linear operators. The first operator is a filtering operation which follows the same structure as that of the feed-forward filter. The second operator is a parallel implementation of the delay.

Returning to FIG. 3, it will be noted that the IIR filter 300 can be viewed as a cascade of the feed-forward FIR all-zero filter 304 and the feed-back all-pole filter formed by the combination of the FIR filter 306, delays (embedded into the transfer function), and summers 314. Hence, filter can be referred to as a zero-pole filter (since the zero filter is first, followed by the pole filter).

Figure 10:
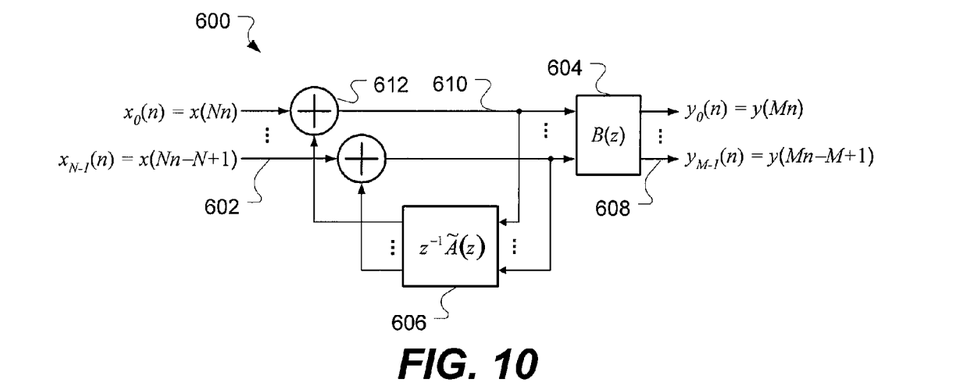
FIG. 10 is a block diagram of another detailed arrangement of a parallel-input parallel-output infinite impulse response filter in accordance with some embodiments of the present invention.

Because the filters are linear operators, and linear operators are commutative, the order of the filtering can be reversed. Accordingly, FIG. 10 illustrates an alternate form of a parallel-input parallel-output IIR filter 600. This filter can be referred to as a pole-zero filter, since parallel-input samples 602 are first filtered by an all-pole filter (formed from FIR filter 606, embedded delays, and summers 612) to produce parallel intermediate samples 610, The intermediate samples and then filtered by an all-zero filter 604 to produce parallel-output samples 608. The delays in the feed-back section have again been absorbed into the all-pole filter for simplicity in representation.

The filter 600 uses an N-input N-output feed-back filter and an N-input M-output feed-forward filter. The arrangement of FIG. 10 may, for example, be preferred when M>N (i.e. the IIR filter is an interpolating (upsampling) filter), while the arrangement of FIG. 3 may, for example, be preferred when M<N (i.e. the IIR filter is a decimating (downsampling) filter). In short, this is because one of the FIR filters is an M-input N-output filter in either case, while in FIG. 3 one FIR filter is M-input M-output and in FIG. 10 one FIR filter is N-input N-output. Which filter arrangement is preferred in any given situation can also be dependent on the length of the filters (i.e., the number of pole taps and the number of zero taps), the ratio of sample rate change (i.e., D or U), and the overall level of parallelism (i.e., N and M).

Figure 11:
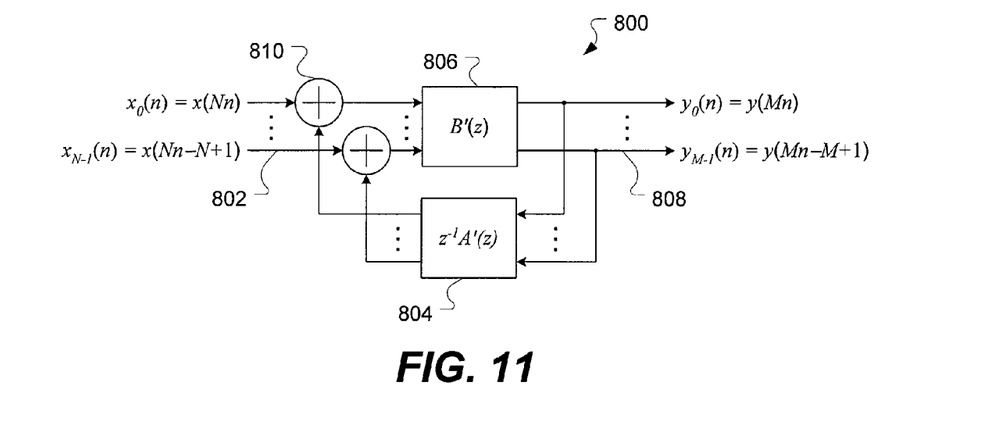
FIG. 11 is a block diagram of yet another detailed arrangement of a parallel-input parallel-output infinite impulse response filter in accordance with some embodiments of the present invention.

Yet another arrangement of a parallel-input parallel-output IIR filter 800 is shown in FIG. 11. Again, two FIR filters are used, but here the feed-back summers 810 are positioned at the input of the all-zero feed-forward filter 806, summing the output of the all-zero feed-back filter 804 and the parallel-input samples 802. The output of the all-zero feed-forward filter is provided as the parallel-output samples 808 of the filter and also provided as the inputs to the all-pole feed-back filter. The feed-forward filter is an N-input M-output filter (N=M, N<M, N>M) and the feed-back filter is an M-input N-output filter. The form of FIG. 11 may be advantageous for some degrees of parallelism (N, M) and the length of the filter responses.

Figuring the filter coefficients for the filter 800 is slightly different than for that of FIG. 3 and FIG. 10.

Following the system block diagram in the z-domain, the output, Y(z), can be written as:

$$Y(z) = B'(z)W(z) \quad (20)$$
$$= B'(z)(X(z) - U(z))$$
$$= B'(z)X(z) - z^{-1}A'(z)B'(z)Y(z)$$

where X(z) and Y(z) are the z-transform of the input signal, x(n), and the output signal, y(n), respectively. Thus, the linear system transfer function is described by $$H(z) = \frac{Y(z)}{X(z)} = \frac{B'(z)}{1 + z^{-1}A'(z)B'(z)}. \quad (21)$$

This is equivalent to the traditional IIR system if we choose the feed-forward and feed-back filter coefficients to satisfy:

$$B(z) = B'(z) \quad (22)$$
$$A(z) = z^{-1}A'(z)B'(z)$$

Figure 12:
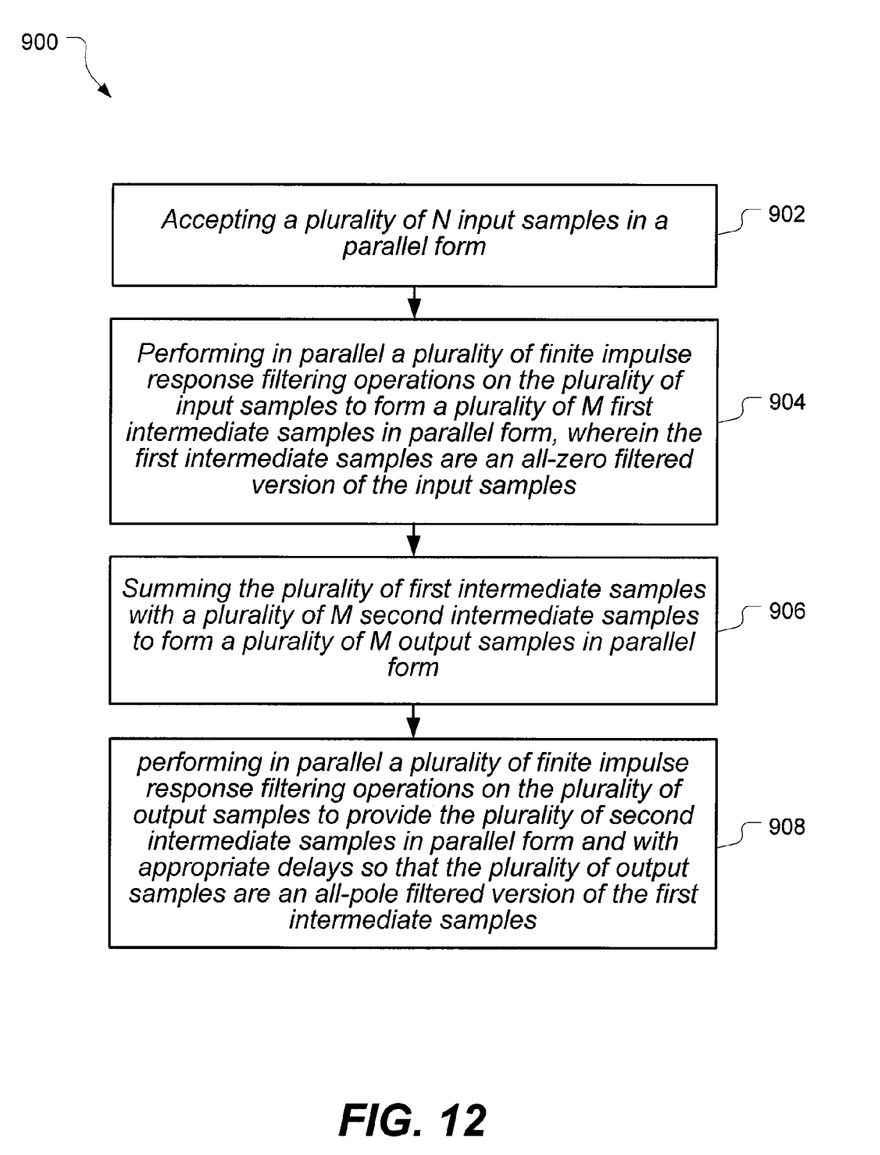
FIG. 12 is a flow chart of a method for performing a parallel-input parallel-output infinite impulse response filter in accordance with some embodiments of the present invention.
Figure 13:
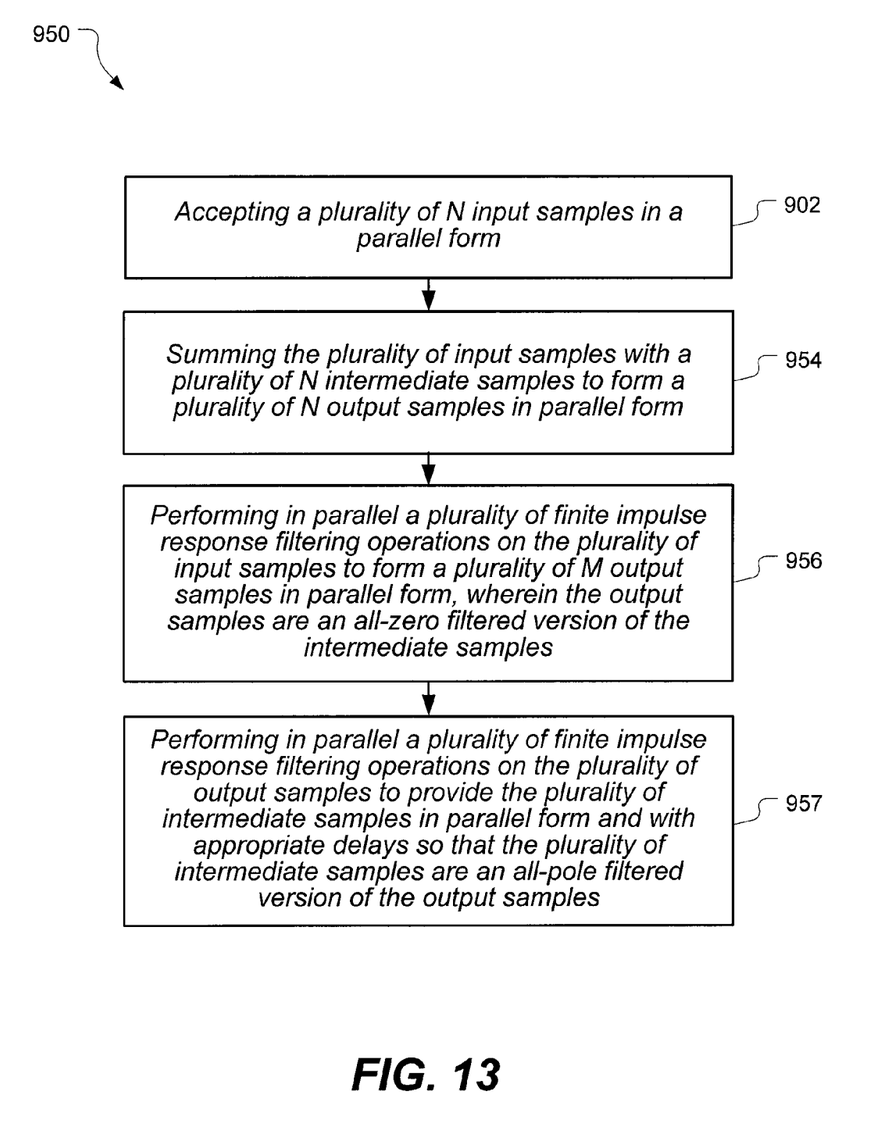
FIG. 13 is a flow chart of another method for performing a parallel-input parallel-output infinite impulse response filter in accordance with some embodiments of the present invention.

FIGS. 12 and 13 describe methods for performing a parallel-input parallel-output infinite impulse response filter. The methods 900, 950 can each include accepting 902 a plurality of N input samples in parallel form. As discussed above, the input samples can be representative of actual analog signals that have been digitized, for example, using an analog to digital converter. Each of the methods can include performing two parallel finite impulse response filtering operations, one being an all-zero filtering operation 904, 956 and the other being an all-pole filtering operation 908, 958. The methods can differ in the order in which the filtering operations are performed. As a part of the all-pole filtering operation, parallel feed back (output of the all-pole FIR filter) can be summed 906, 954. The output of the filtering can also provided in a parallel form. The output of the filter may eventually be converted to an analog signal, for example, using a digital to analog converter. Either the input or output of methods may also have additional operations performed on the digital samples, including for example, other filtering, sample rate conversions, signal processing, and the like.

The methods 900, 950 can be implemented using a processor, including a digital signal processor, general purpose processor, or the like in which case computer readable instructions can be provided on a computer readable media to cause the processor to execute the method. Various computer readable media are known in the art, including for example, memory devices such as flash memory, programmable read only memory, mask-programmed read only memory, fuse-programmable memory, magnetic memory, ferro-electric memory, optical memory, and the like.

The methods 900, 950 can also be implemented using digital hardware, including application specific integrated circuits, fully custom integrated circuits, field programmable gate arrays, discrete digital hardware, and the like. Individual operations in digital logic can be performed using multipliers, adders, subtractors, lookup tables, memories, and similar elements. Digital logic may be designed and expressed in a hardware description language such as Verilog™ or VHDL in either behavioral or structural descriptions (sometimes also referred to as soft or hard macros). Hardware description language may provide for bit widths, number of filter segments, number of coefficients, parallelism, decimation/interpolation factors, and other parameters to be configurable parameters which are specified by a designer at synthesis time.

Summarizing and reiterating to some extent, a parallel-input parallel-output infinite impulse response filter has been developed. The filter can be used in a wide variety of signal processing applications. By providing both parallel-input and parallel-output, high throughput can be obtained through the filter without requiring high input and output sample rates. The filter response can include both poles and zeros. The filter is also applicable to upsampling and downsampling sample rate changing using polyphase techniques. Various arrangements of the filter can be used, allowing for high computational efficiency as a function of the sample rate change factor and relative lengths of the pole filter and zero filter. While various particular filter arrangements have been shown for illustration purpose, it will be appreciated that implementation of the FIR filter components can use various arrangements, including for example direct form, transpose form, cascade form, lattice form, frequency sampling, using Fourier transforms, and the like. Accordingly, the invention is not limited to any particular FIR filter form.

It is to be understood that the above-referenced arrangements are illustrative of the application for the principles of the present invention. It will be apparent to those of ordinary skill in the art that numerous modifications can be made without departing from the principles and concepts of the invention as set forth in the claims.

The invention claimed is:

1. A parallel-input parallel-output infinite impulse response filter comprising:
    a first finite impulse response filter having a parallel input and a parallel output;
    a plurality of delays coupled to the first finite impulse response filter;

a plurality of summers coupled in a feed-back arrangement to the plurality of delays and to the first finite impulse response filter so as to form an all-pole filter; and a second finite impulse response filter having a parallel input and a parallel output to form an all-zero filter, wherein the second finite impulse response filter is configured to produce filtered samples at the parallel output from input samples at the parallel input, and wherein each of the input samples at the parallel input is different than any previous input samples, wherein the first finite impulse response filter and the second finite impulse response filter are coupled to form a parallel-input parallel-output infinite impulse response filter having both poles and zeros.

2. The parallel-input parallel-output infinite impulse response filter of claim 1, wherein the all-zero filtered output produced by the second finite impulse response filter is input to the first finite impulse response filter.

3. The parallel-input parallel-output infinite impulse response filter of claim 2, wherein the second finite impulse response filter is an N-input, M-output filter, and the first finite impulse response filter is an M-input, M-output filter, so that the parallel-input parallel-output infinite impulse response filter provides a sample rate conversion of M/N.

4. The parallel-input parallel-output infinite impulse response filter of claim 3, wherein M<N, so that the parallel-input parallel-output infinite impulse response filter is a decimating filter.

5. The parallel-input parallel-output infinite impulse response filter of claim 3, wherein M>N, so that the parallel-input parallel-output infinite impulse response filter is an interpolating filter.

6. The parallel-input parallel-output infinite impulse response filter of claim 1, wherein the all-pole filtered output produced by the first finite impulse response filter is input to the second finite impulse response filter.

7. The parallel-input parallel-output infinite impulse response filter of claim 6, wherein the first finite impulse response filter is an N-input, N-output filter and the second finite impulse response filter is an N-input, M-output filter so that the parallel-input parallel-output infinite impulse response filter provides a sample rate conversion of M/N.

8. The parallel-input parallel-output infinite impulse response filter of claim 1, wherein the all-zero filtered output produced by the second finite impulse response filter is input to the first finite impulse response filter and the plurality of summers are arranged to sum the all-pole output produced by the first finite impulse response filter into the plurality of inputs to the second finite impulse response filter.

9. The parallel-input parallel-output infinite impulse response filter of claim 8, wherein the second finite impulse response filter is an N-input, M output filter, and the first finite impulse response filters is an M-input, N-output filter, so that the parallel-input parallel-output infinite impulse response filter provides a sample rate conversion of M/N.

10. The parallel-input parallel output infinite impulse response filter of claim 9, wherein M≠N, so that the parallel-input parallel-output infinite impulse response filter is either a decimating or an interpolating filter.

11. The parallel-input parallel-output infinite impulse response filter of claim 1, wherein the filter is implemented in any one of a field programmable gate array and an application integrated circuit.

12. The parallel-input parallel-output infinite impulse response filter of claim 1, wherein the second finite impulse response filter comprises sets of filter segments, wherein each of the parallel inputs of the second finite impulse response filter is provided to one of the filter segments in each of the sets, and each of the parallel outputs of the second finite impulse response filter is a sum of all of the outputs of the filter segments of one of the sets.

13. The parallel-input parallel-output infinite impulse response filter of claim 1, wherein each of the delays has a delay of one sample interval.

14. The parallel-input parallel-output infinite impulse response filter of claim 1, wherein outputs of the summers are coupled to inputs of the second finite impulse response filter.

15. The parallel-input parallel-output infinite impulse response filter of claim 1, wherein the second finite impulse response filter is configured to produce each of the parallel outputs of the second finite impulse response filter from the same ones of the parallel inputs of the second finite impulse response filter.

* * * * *